(12) United States Patent
Thio et al.

(10) Patent No.: US 6,716,710 B1
(45) Date of Patent: Apr. 6, 2004

(54) USING A FIRST LINER LAYER AS A SPACER IN A SEMICONDUCTOR DEVICE

(75) Inventors: Hsiao-Han Thio, Sunnyvale, CA (US); Nian Yang, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/126,207

(22) Filed: Apr. 19, 2002

(51) Int. Cl.[7] .................. H01L 21/336; H01L 21/8238; H01L 21/76; H01L 21/3205; H01L 21/311

(52) U.S. Cl. .................. 438/303; 438/221; 438/294; 438/296; 438/305; 438/424; 438/595; 438/696

(58) Field of Search .................. 438/303, 305, 438/424, 294, 296, 595, 696, 221

(56) References Cited

U.S. PATENT DOCUMENTS

| | | | | |
|---|---|---|---|---|
| 5,880,006 A | * | 3/1999 | Lin et al. | 438/424 |
| 5,918,131 A | * | 6/1999 | Hsu et al. | 438/296 |
| 6,004,852 A | * | 12/1999 | Yeh et al. | 438/303 |
| 6,013,569 A | * | 1/2000 | Lur et al. | 438/595 |
| 6,040,223 A | * | 3/2000 | Liu et al. | 438/303 |
| 6,110,790 A | * | 8/2000 | Chen | 438/305 |
| 6,165,826 A | * | 12/2000 | Chau et al. | 438/231 |
| 6,165,857 A | * | 12/2000 | Yeh et al. | 438/303 |
| 6,200,840 B1 | * | 3/2001 | Chen et al. | 438/184 |
| 6,287,925 B1 | * | 9/2001 | Yu | 438/301 |
| 6,291,354 B1 | * | 9/2001 | Hsiao et al. | 438/701 |
| 6,312,998 B1 | * | 11/2001 | Yu | 438/303 |
| 6,391,732 B1 | * | 5/2002 | Gupta et al. | 438/305 |
| 6,444,532 B2 | * | 9/2002 | Hasegawa | 438/303 |
| 6,489,206 B2 | * | 12/2002 | Chen et al. | 438/300 |

* cited by examiner

*Primary Examiner*—Mary Wilczewski
*Assistant Examiner*—Toniae M. Thomas

(57) ABSTRACT

A method of fabricating a semiconductor device. A first layer comprising a first material is deposited to a first thickness on a sidewall of a stacked gate. A second layer comprising a second material is deposited over the first layer. The second layer is deposited without the first layer being etched; hence, the first thickness is unchanged along the sidewall. The second layer is reduced to a second thickness along the sidewall. The first layer and the second layer in combination form a spacer along the sidewall that has a thickness corresponding to the first thickness and the second thickness. Thus, the spacer can be formed using a single etch, reducing the number of processing steps. In addition, the first layer protects shallow trench filler material from gouging during the etch.

6 Claims, 6 Drawing Sheets

USING A FIRST LINER LAYER AS A SPACER IN A SEMICONDUCTOR DEVICE

TECHNICAL FIELD

The present claimed invention generally relates to semiconductors. More specifically, the present claimed invention relates to a method of forming a semiconductor device.

BACKGROUND ART

Various techniques known in the art can be used to fabricate a semiconductor device such as an integrated circuit or processor. In general, these techniques typically involve applying a layer of material to an underlying substrate or over a preceding layer, and then selectively removing the material using an etch process. Using these techniques, the components of a semiconductor device, perhaps comprising different types of material, can be accurately formed and placed.

One type of component used by semiconductor devices is an isolation device. An isolation device, in general, includes a stacked gate isolated from an adjacent stacked gate by a shallow trench. The isolation device also typically includes a spacer formed on the sidewalls of the stacked gate.

Prior Art FIGS. 1A through 1E illustrate a prior art process for forming spacers in an isolation device. For simplicity of discussion, the process is described for a single spacer 50 (FIG. 1E) formed on the sidewall 11 of a stacked gate 10 adjacent to a shallow trench 12. Shallow trench 12 is filled with a material such as high density plasma (HDP) oxide.

Referring first to FIG. 1A, a liner layer 14 of a first material, typically TEOS (tetraethylorthosilicate), is deposited over stacked gate 10 (including sidewall 11) and shallow trench 12. Liner layer 14 has a thickness of approximately 150 Angstroms (Å).

Next referring to FIG. 1B, a layer 16 of a second material, typically nitride, is deposited over the liner layer 14. Referring now to FIG. 1C, an etch of layers 14 and 16 is performed, removing the nitride and essentially all of the TEOS from the horizontal surfaces of the isolation device; however, a thin layer of TEOS typically remains on the surface 18 over shallow trench 12. Also, a layer 14 of TEOS and a layer 16 of nitride also remain on the sidewall of stacked gate 10.

With reference to FIG. 1D, a layer 20 of material, typically nitride, is deposited over the remaining portions of layers 14 and 16. Referring now to FIG. 1E, an etch of layer 20 is performed to remove layer 20 from the horizontal surfaces of the isolation device and to form a spacer 50 having a prescribed (design) thickness T1. Spacer 50 is thus formed of layers 14, 16 and 20 using a process that includes two etches.

A problem with the process illustrated by FIGS. 1A through 1E is that, during the second etch, relatively significant gouging of the HDP oxide in shallow trench 12 often occurs. The liner layer 14 is reduced to a thin layer, or effectively removed, during the first etch. Any remaining portion of layer 14 is not sufficiently thick to withstand the second etch and serve as a protective layer for the shallow trench 12 for the duration of the second etch. Consequently, shallow trench 12 is exposed during the second etch, allowing the HDP oxide to be gouged by the etch.

As a result of the gouging, isolation issues may be introduced, reducing the effectiveness of the isolation device. If these isolation issues are not detected or corrected, the performance of the semiconductor device may also be affected. Detection and correction of the gouging can reduce the yield (throughput) of the fabrication process and increase the unit cost of the semiconductor device.

Accordingly, what is needed is a method and/or system that can be used to form spacers in an isolation device, but without gouging the shallow trench filler material. It is desirable that such a method and/or system accomplishes this while also improving yield and throughput. The present invention provides a novel solution to this need.

SUMMARY OF THE INVENTION

Embodiments of the present invention provide a method and system thereof that can be used to form spacers in an isolation device but without gouging the shallow trench filler material, with expected improvements in yield and throughput.

In one embodiment, a first layer comprising a first material is deposited to a first thickness on a sidewall of a stacked gate. A second layer comprising a second material is deposited over the first layer. The second layer is deposited without the first layer being etched; hence, the first thickness is unchanged along the sidewall. The second layer is etched and thereby reduced to a second thickness along the sidewall. The first layer and the second layer in combination form a spacer along the sidewall that has a thickness corresponding to the first thickness and the second thickness. Thus, according to the present embodiment of the present invention, the spacer is formed using a single etch.

In one embodiment, the first material comprises TEOS (tetraethylorthosilicate). In another embodiment, the second material comprises nitride.

In one embodiment, the stacked gate adjoins a shallow trench. In one such embodiment, the shallow trench is substantially filled with material comprising high density plasma (HDP) oxide. In another such embodiment, the first layer and the second layer are also deposited over the shallow trench, and the first layer protects the HDP oxide during the etching of the second layer.

In one embodiment, the first thickness is between approximately 300 and 500 Angstroms. In another embodiment, the second thickness is between approximately 950 and 1150 Angstroms.

In its various embodiments, the present invention reduces the number of processing steps, using one etch to form the spacer instead of multiple etches, and protects the shallow trench (e.g., the HDP oxide filler material) from gouging during the etch.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

The drawings referred to in this description should be understood as not being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductors. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "receiving," "etching," "depositing" or the like, refer to actions and processes (e.g., process 300 of FIG. 3) of semiconductor fabrication.

Figure 1A:
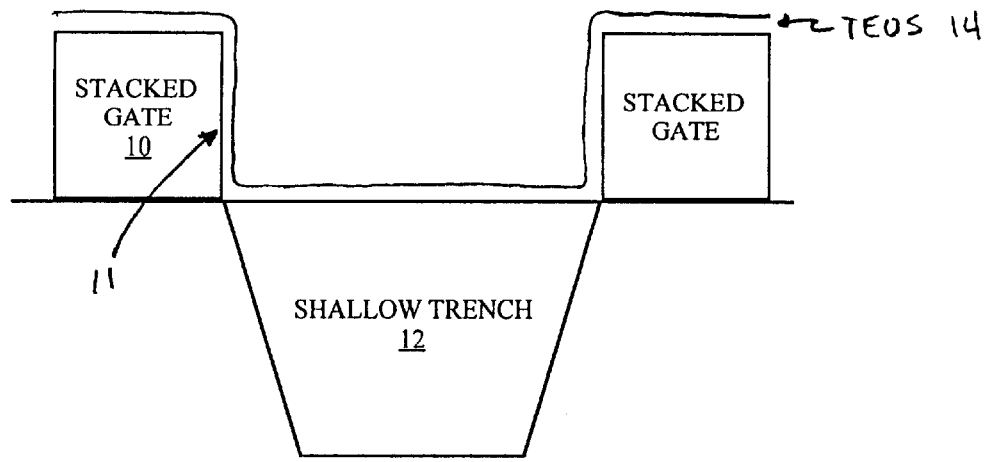
FIGS. 1A, 1B, 1C, 1D and 1E illustrate a process for forming a spacer in a semiconductor device according to the prior art.
Figure 1B:
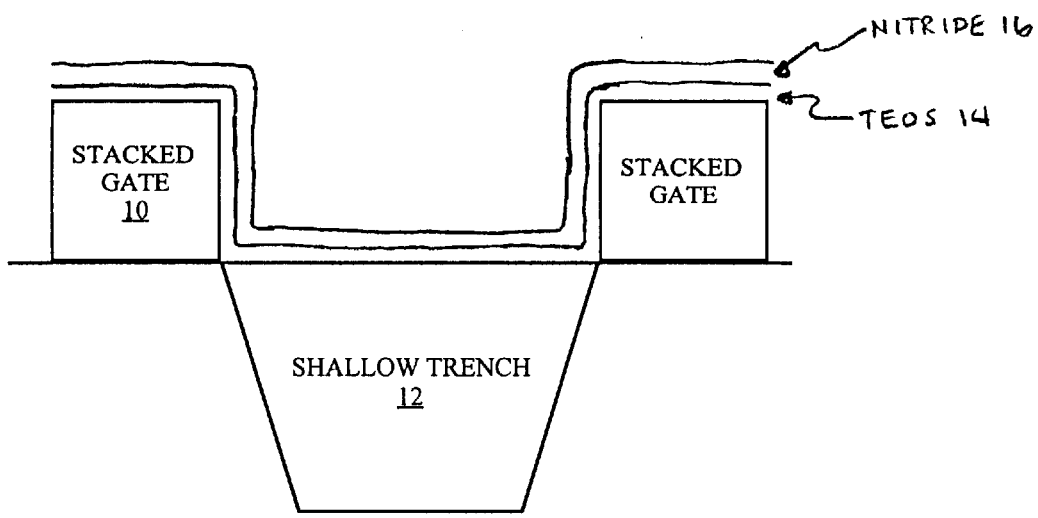
Figure 1C:
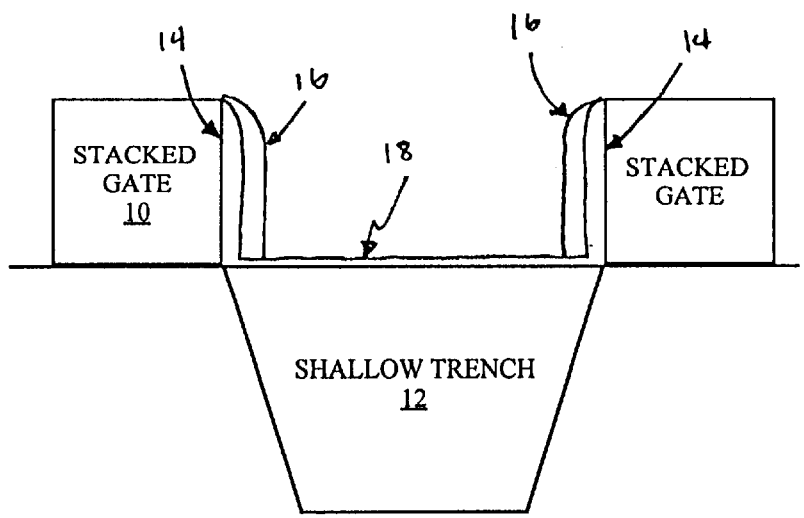
Figure 1D:
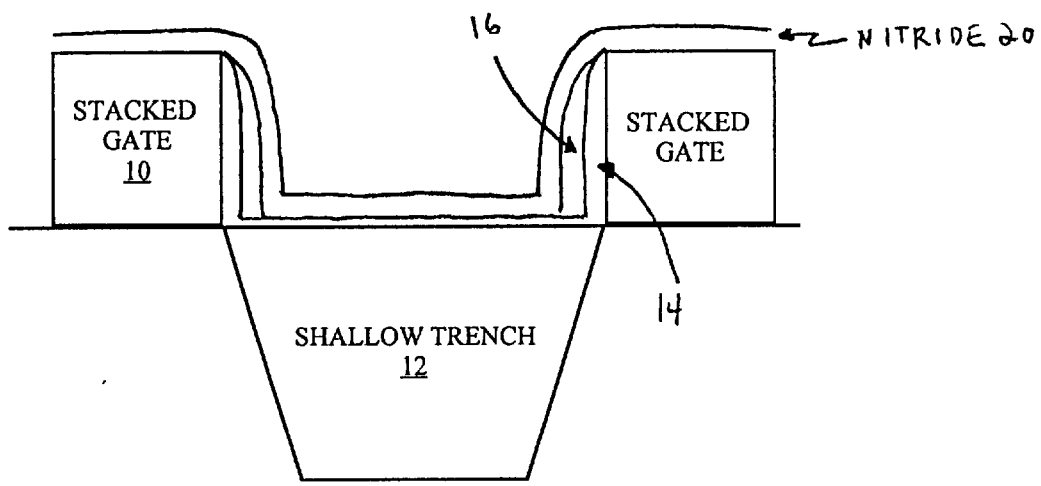
Figure 1E:
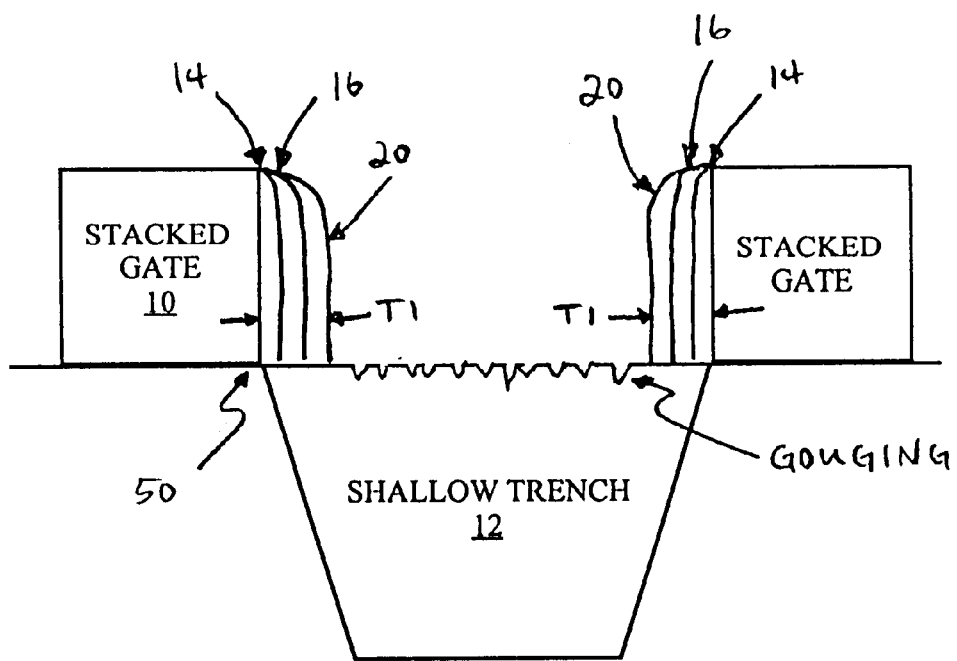
Figure 2A:
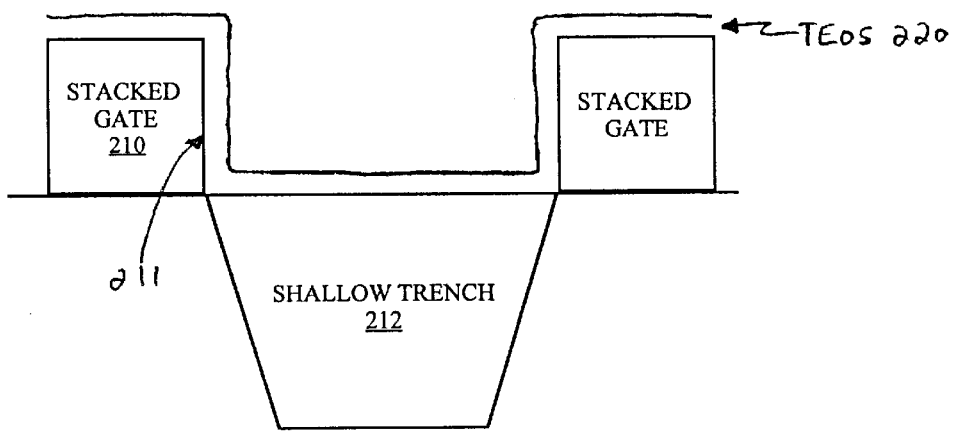
FIGS. 2A, 2B and 2C illustrate a process for forming a spacer in a semiconductor device according to one embodiment of the present invention.
Figure 2B:
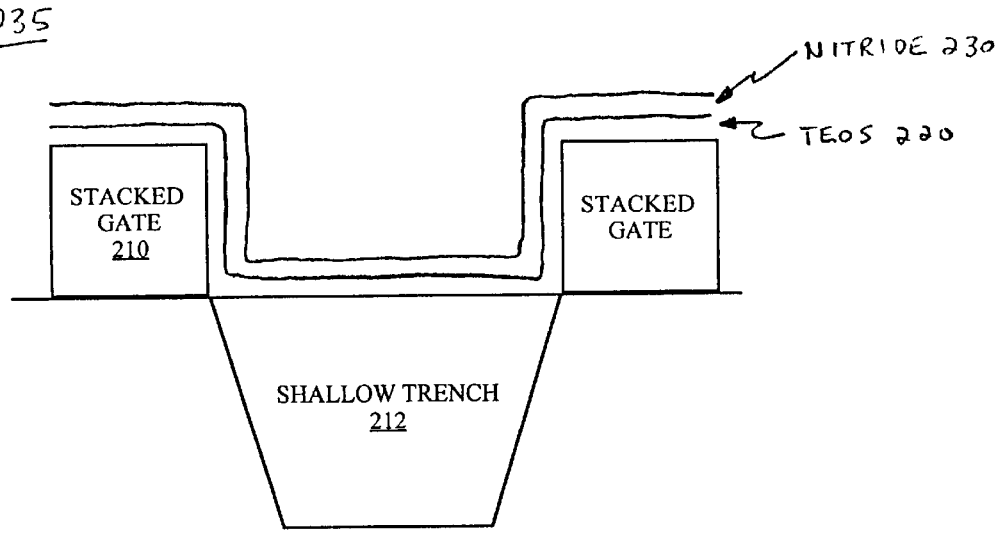
Figure 2C:
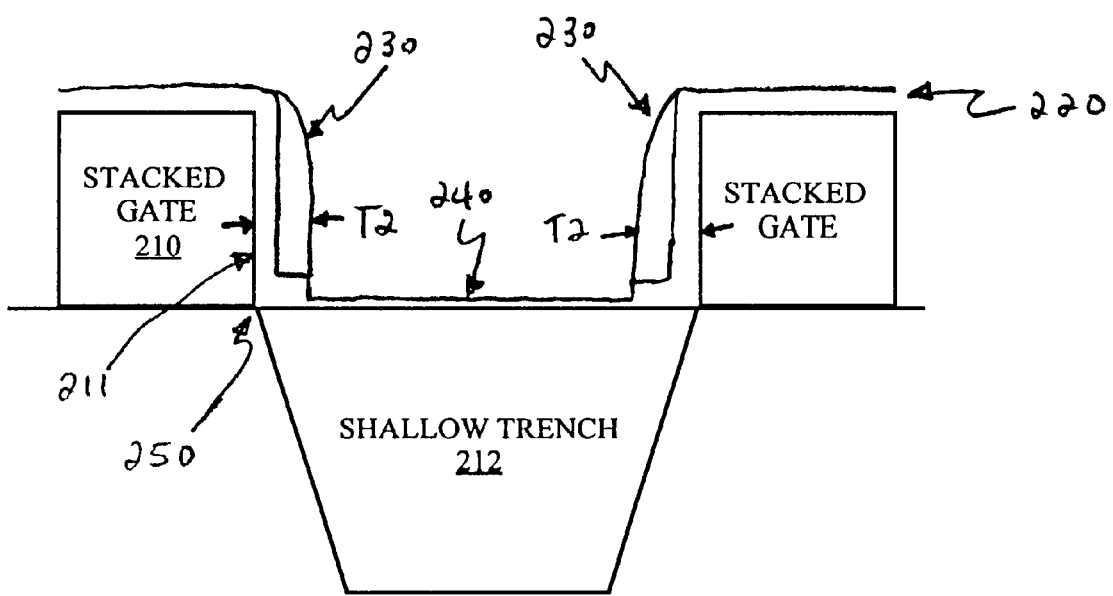

FIGS. 2A, 2B and 2C illustrate a process for forming a spacer in a semiconductor device (e.g., in an isolation device) according to one embodiment of the present invention. For simplicity of discussion and illustration, the process is described for a single spacer 250 (FIG. 2C) formed on the sidewall 211 of a stacked gate 210 adjacent to a shallow trench 212. It is appreciated that other processes and steps associated with the fabrication of a semiconductor device may be performed along with the process illustrated by FIGS. 2A through 2C. Importantly, embodiments of the present invention can be implemented in conjunction with these other (conventional) processes and steps without significantly perturbing them. Generally speaking, the various embodiments of the present invention can replace a conventional process without significantly affecting the peripheral processes and steps.

With reference first to FIG. 2A, in the present embodiment, a layer 220 of a first material is deposited over stacked gate 210 (including sidewall 211) and shallow trench 212. In one embodiment, layer 220 comprises TEOS (tetraethylorthosilicate). In one embodiment, shallow trench 212 is substantially filled with a material that comprises high density plasma (HDP) oxide. It is appreciated that other suitable materials may be utilized in accordance with the present invention.

According to the present embodiment of the present invention, the layer 220 is thicker relative to liner layers employed in the prior art. As will be seen, layer 220 is chosen to be thick enough to withstand etching and thus serve as a protective layer for shallow trench 212, yet thin enough to be a part of a spacer of a prescribed (design) thickness. In one embodiment, the layer 220 has a thickness of approximately 300 Angstroms (Å). In another embodiment, the thickness of layer 220 ranges from approximately 300 to 500 Å.

Referring now to FIG. 2B, in the present embodiment, a layer 230 of a second material is deposited over layer 220. In one embodiment, layer 230 comprises nitride. It is appreciated that another suitable material may be utilized in accordance with the present invention. The thickness of the second layer is selected depending on the desired (prescribed) thickness of the spacer to be formed. In one embodiment, the initial thickness (that is, the thickness before etching) of the second layer ranges from approximately 950 to 1150 Å.

With reference to FIG. 2C, in the present embodiment, etching is performed to form a spacer 250 of the prescribed (design) thickness T2. In the present embodiment, the etching reduces the thickness of layer 230 along sidewall 211, while entirely removing layer 230 in the horizontal region above shallow trench 212. In the present embodiment, along the sidewall 211 of stacked gate 210, the thickness of layer 220 is unchanged where it underlies layer 230, while the etch removes a portion of layer 220 in the horizontal region above shallow trench 212.

Significantly, a relatively thin layer of layer 220 (e.g., layer 240) remains above shallow trench 212 during and perhaps after the etch, although the entire thickness of layer 230 above shallow trench 212 is etched away. That is, the initial thickness of layer 220 was advantageously chosen to withstand the etch and thus layer 220 can serve as a protective layer for shallow trench 212 for the duration of the etch. As a result, gouging of the shallow trench filler material (e.g., the HDP oxide) is prevented.

Also of significance, the initial thicknesses of layer 220 and layer 230 are selected to achieve the prescribed (design) thickness T2 of spacer 250. Thus, layer 220 is advantageously chosen to be thick enough to withstand the etch and also to form, in combination with the remaining (reduced) thickness of layer 230, a spacer 250 having a thickness T2.

Moreover, the prescribed (design) thickness T2 of spacer 250 is accomplished in a single etch. Thus, in accordance with the present embodiment of the present invention, the number of process steps is reduced. Specifically, according to one embodiment, a nitride deposition step and an etch step are eliminated.

Figure 3:
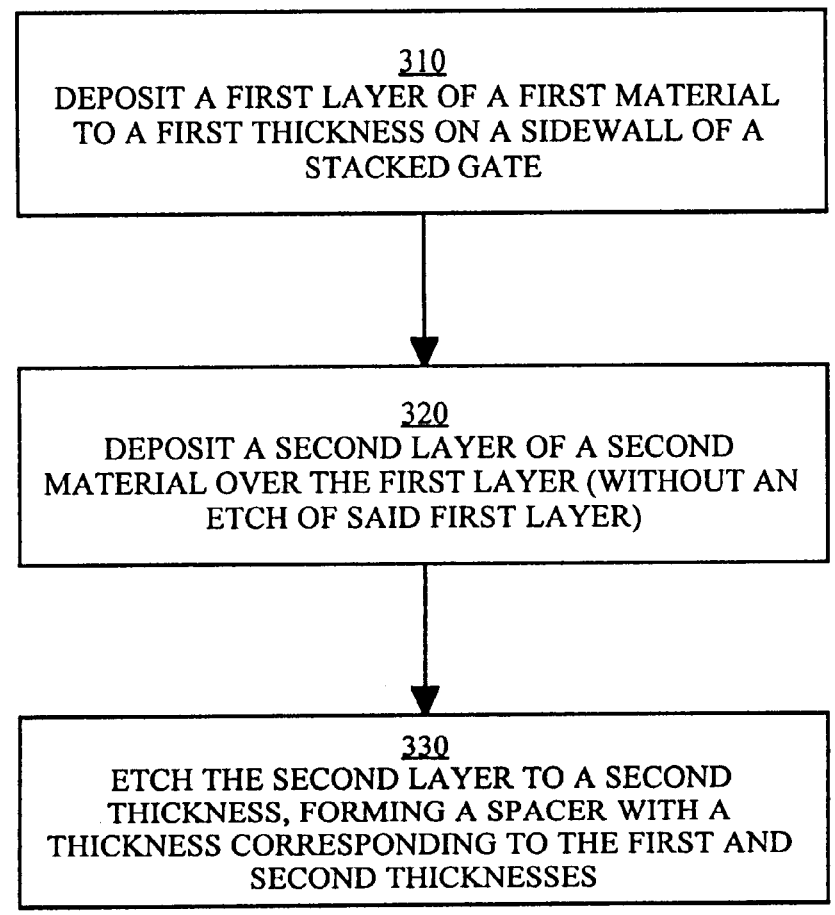
FIG. 3 is a flowchart of a process for forming a spacer in a semiconductor according to one embodiment of the present invention.

FIG. 3 is a flowchart 300 of a process for forming a spacer in a semiconductor device (e.g., in an isolation device) according to one embodiment of the present invention. Although specific steps are disclosed in flowchart 300, such steps are exemplary. That is, the present invention is well suited to performing various other steps or variations of the steps recited in flowchart 300.

In step 310, in the present embodiment, a first layer comprising a first material is deposited to a first thickness (depth) on a sidewall of a stacked gate. In one embodiment, the first material comprises TEOS (tetraethylorthosilicate). In one embodiment, the first thickness is between approximately 300 and 500 Angstroms.

In one embodiment, the stacked gate adjoins a shallow trench. In one such embodiment, the shallow trench is substantially filled with material comprising high density plasma (HDP) oxide. In another such embodiment, the first layer is also deposited over the shallow trench, and this portion of the first layer protects the shallow trench during a subsequent etching (step 330).

In step 320, in the present embodiment, a second layer comprising a second material is deposited over the first layer. In one embodiment, the second layer has an initial thickness (depth) of between approximately 950 and 1150 Angstroms. The second layer is deposited without the first layer being etched. In one embodiment, the second material comprises nitride.

In step 330, in the present embodiment, the second layer is etched and thereby reduced to a second thickness along the sidewall of the stacked gate. The first thickness (along the sidewall) is unchanged by the etch. The first layer and the second layer in combination form a spacer that has a thickness corresponding to the first thickness and the second thickness; that is, the thickness of the spacer is approximately equal to the sum of the initial thickness of the first layer and the reduced thickness of the second layer. Thus, according to the present embodiment of the present invention, the spacer is formed using a single etch.

As mentioned in conjunction with step 310, the portion of the first layer over the shallow trench protects the shallow trench (specifically, the shallow trench filler material) from gouging during the etch.

Thus, embodiments of the present invention provide a method and system thereof that can be used to form spacers in an isolation device, but without gouging the shallow trench. Only a single etch is performed, thus reducing the number of processing steps, which may lead to improvements in yield and throughput while reducing unit cost.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device, said method comprising:

receiving a substrate comprising a stacked gate and a shallow trench adjacent to said stacked gate, said substrate further comprising a first layer comprising a first material disposed over said stacked gate and said shallow trench and a second layer comprising a second material disposed over said first layer, wherein said first layer has a substantially uniform first thickness along a sidewall of said stacked gate, wherein said first material comprises TEOS (tetraethylorthosilicate) and wherein said first thickness is between approximately 300 and 500 Angstroms; and etching said second layer, said second layer reduced to a second thickness, said first thickness unchanged by said etching, said first layer and said second layer in combination forming a spacer along said sidewall of said stacked gate, said spacer having a thickness corresponding to said first thickness and said second thickness;

wherein said spacer is formed using a single etch.

2. The method of claim 1 wherein said second material comprises nitride.

3. The method of claim 1 wherein said shallow trench is substantially filled with material comprising high density plasma (HDP) oxide.

4. The method of claim 3 wherein said first layer and said second layer are deposited over said shallow trench, wherein said first layer protects said HDP oxide during said etching of said second layer.

5. The method of claim 1 wherein said second layer has an initial thickness of between approximately 950 and 1150 Angstroms.

6. The method of claim 1 wherein said semiconductor device comprises an isolation device.

\* \* \* \* \*